United States Patent
Lee et al.

(10) Patent No.: US 7,824,823 B2
(45) Date of Patent: Nov. 2, 2010

(54) MASK, METHOD OF FABRICATING THE SAME, AND METHOD OF FABRICATING ORGANIC ELECTRO-LUMINESCENCE DEVICE USING THE SAME

(75) Inventors: Il Ho Lee, Gyeongsangbuk-do (KR); Chong Hyun Park, Daegu (KR); Hyo Dae Bae, Daegu (KR)

(73) Assignee: LG Display Co., Ltd., Seoul (KR)

( * ) Notice: Subject to any disclaimer, the term of this patent is extended or adjusted under 35 U.S.C. 154(b) by 1339 days.

(21) Appl. No.: 11/047,693

(22) Filed: Feb. 2, 2005

(65) Prior Publication Data

US 2005/0167395 A1    Aug. 4, 2005

(30) Foreign Application Priority Data

Feb. 4, 2004    (KR) ............... 10-2004-0007250

(51) Int. Cl.
   *G03F 1/00*    (2006.01)
(52) U.S. Cl. .................. 430/5; 430/311; 430/324
(58) Field of Classification Search ............... 430/311, 430/5, 324
   See application file for complete search history.

(56) References Cited

U.S. PATENT DOCUMENTS

| | | | |
|---|---|---|---|
| 4,048,536 A * | 9/1977 | Brown | 313/403 |
| 6,280,273 B1 * | 8/2001 | Codama | 445/24 |
| 6,602,643 B2 * | 8/2003 | Nikaidou et al. | 430/24 |
| 6,653,053 B2 * | 11/2003 | Mangat et al. | 430/311 |
| 2002/0006555 A1 * | 1/2002 | Hasegawa et al. | 430/5 |

FOREIGN PATENT DOCUMENTS

KR    2002088927 A * 11/2002

* cited by examiner

*Primary Examiner*—Mark F Huff
*Assistant Examiner*—Rashid Alam
(74) *Attorney, Agent, or Firm*—Birch, Stewart, Kolasch & Birch LLP

(57) ABSTRACT

This invention relates to a mask, a method of fabricating the same, and a method of fabricating organic electro-luminescence device using the same that is capable of minimizing a difference of a rigidity coefficient value of both an open part and a blocking part. The mask includes: an open part formed in a hole type to pass an organic material for forming a first organic layer on a substrate; and a blocking part having a plurality of grooves formed at other areas except for the open part.

9 Claims, 13 Drawing Sheets

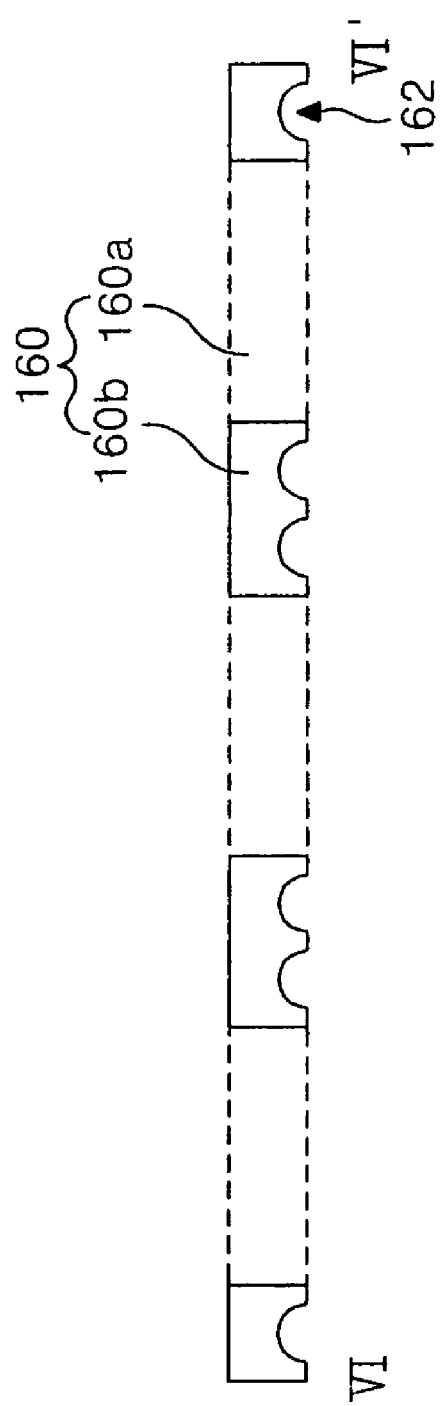

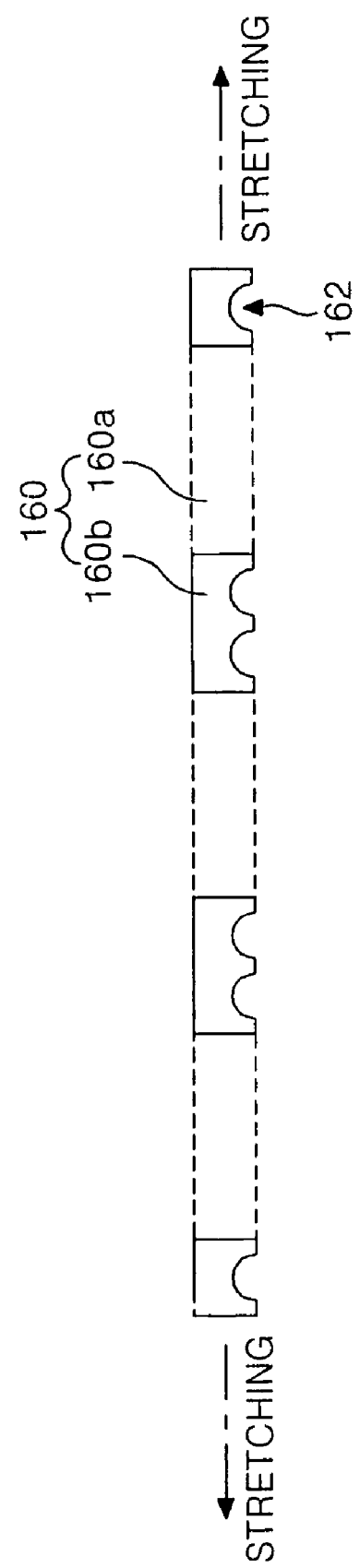

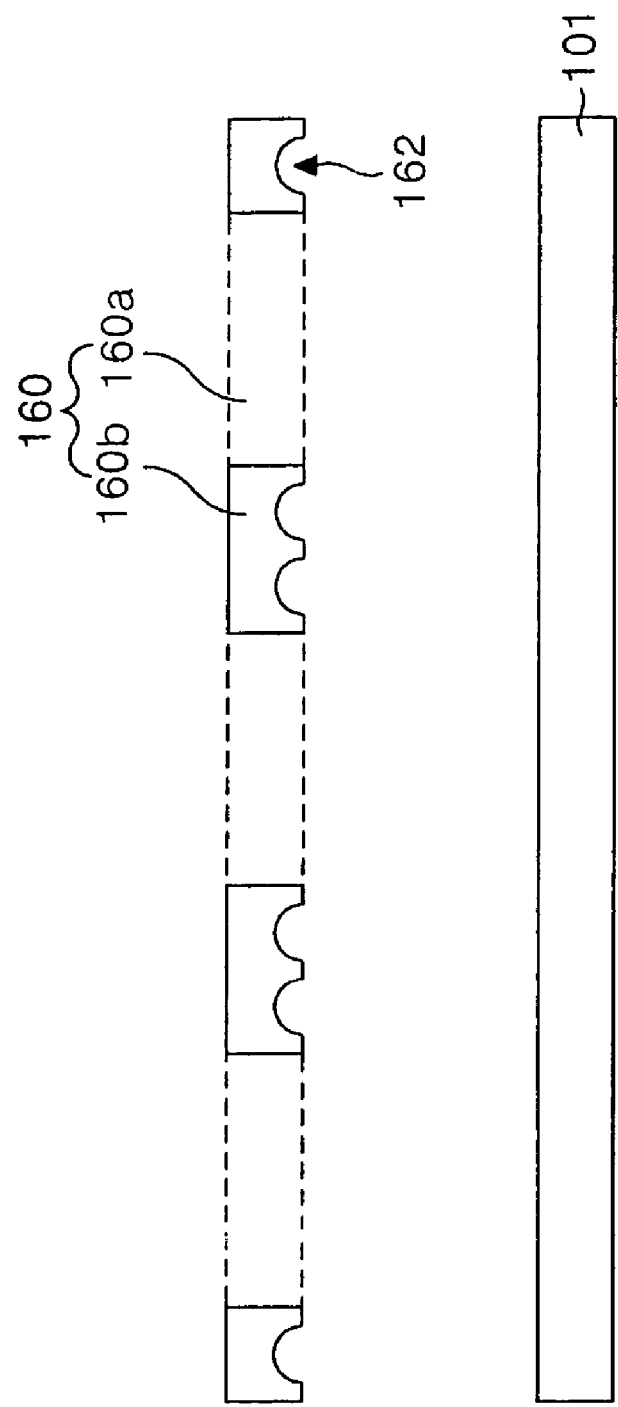

ed in weight and bulk that is capable of
MASK, METHOD OF FABRICATING THE SAME, AND METHOD OF FABRICATING ORGANIC ELECTRO-LUMINESCENCE DEVICE USING THE SAME This application claims the benefit of Korean Patent Application No. P2004-07250 filed in Korea on Feb. 4, 2004, which is hereby incorporated by reference.

BACKGROUND OF THE INVENTION

1. Field of the Invention

This invention relates to a mask, and more particularly, to a mask, a method of fabricating the same, and a method of fabricating organic electro-luminescence device using the same that is capable of minimizing a difference of a rigidity coefficient value of both an open part and a blocking part.

2. Description of the Related Art

Recently, there have been developed various flat panel display devices reduced in weight and bulk that is capable of eliminating disadvantages of a cathode ray tube (CRT). Such flat panel display devices include a liquid crystal display (LCD), a field emission display (FED), a plasma display panel (PDP) and an electro-luminescence (EL) display, etc. device.

In such flat panel display devices, the PDP has the most advantage for making a large dimension screen because its structure and manufacturing process are simple, but has a drawback in that it has low light-emission efficiency and large power consumption. The LCD has a difficulty in making a large dimension screen because it is fabricated by a semiconductor process, but has an expanded demand as it is mainly used for a display device of a notebook personal computer. However, the LCD has a drawback in that it has a difficulty in making a large dimension screen and it has large power consumption due to a backlight unit. Also, the LCD has characteristics of a large light loss and a narrow viewing angle due to optical devices such as a polarizing filter, a prism sheet, a diffuser and the like.

On the other hand, the EL display device is largely classified into an inorganic EL device and an organic EL device. When compared with the above-mentioned display devices, the EL display device has advantages of a fast response speed, large light-emission efficiency, a large brightness and a large viewing angle. The organic EL display device can display a picture at approximately 10[V] and a high brightness of ten thousands of [cd/m²].

FIG. 1 is a plan view illustrating a related art organic electro-luminescence (EL) display device, and FIG. 2 is a sectional view illustrating the organic EL display device taken along a line II-II' in FIG. 1.

Referring to FIGS. 1 and 2, the related art organic EL display device comprises a insulating film 6, a barrier rib 8, and an organic layer 10, formed between an anode electrode 4 and a cathode electrode 12. The anode electrode 4 and the cathode electrode 12 are crossing so as to insulate from each other.

A plurality of anode electrodes 4 is provided on the substrate 2 in such a manner to be spaced at a predetermined distance from each other. A first driving signal is supplied to such the anode electrode 4 in order to emit an electron (or hole).

The insulating film 6 is formed in a lattice type so as to expose an aperture for each EL cell area on the substrate 2 having the anode electrode 4.

The barrier rib 8 is formed in a direction crossing the anode electrode 4, and is formed in parallel to the cathode electrode 12 by a predetermined distance to partition adjacent EL cells. In other words, the barrier rib 8 separates the organic layers 10 from each other and the cathode electrodes 12 from each other between the adjacent EL cells. Further, the barrier rib 8 has an overhang structure in which the upper portion thereof has a larger width than the lower portion thereof.

The organic layer 10 is made from an organic compound on the insulating film 6. In other words, the organic layer 10 is formed by depositing a hole carrier layer, a light-emitting layer and an electron carrier layer onto the insulating film 6.

A plurality of cathode electrodes 12 is provided on the organic layer 10 in such a manner to be spaced at a predetermined distance from each other, and in such a manner to be crossed with the anode electrodes 4. A second driving signal is supplied to the cathode electrode 12 in order to emit an electron (hole).

The substrate 2 having the cathode electrode 12 is protected by use of a packaging plate 14. In other words, the packaging plate 14 covers the anode electrode 4, the cathode electrode 12, and the organic layer 10 formed on the substrate 2, by using an sealant (not shown), so as to prevent the organic layer 10 from being deteriorated by moisture and oxygen in the atmosphere. After pressuring the packaging plate 14 to the substrate 12 to encapsulate the anode electrode 4, the cathode electrode 12, and the organic layer 10, the sealant is hardened by irradiating an ultraviolet ray. After encapsulating, an inert gas is injected in a space formed by sealing the substrate 2 and the packaging plate 14. At this time, the encapsulated atmosphere is performed in a globe box or a vacuum chamber.

In the organic EL device, when the first and the second driving signals are respectively applied to the anode electrode 4 and the cathode electrode 12, an electron and a hole are emitted. The electron and the hole emitted from the anode electrode 4 and the cathode electrode 12 recombine in the organic layer 10, and at the same time, visible rays are generated. At this time, the generated visible rays are emitted to the exterior via the anode electrode 4, to thereby display a predetermined picture or image.

Meanwhile, the related art organic layer 10 is formed by using a shadow mask 60 having an open part 60a and a blocking part 60b, as shown in FIG. 3.

In a case that the shadow mask 60 is applied to an organic EL device of a high resolution having a relatively small pixel, as a size of the pixel becomes smaller, a width of the open part 60a becomes narrower and a thickness of the shadow mask becomes thinner so as to prevent a damage of the barrier rib greatly contacting with the shadow mask. For instance, when a size of the pixel is 100 μm, a thickness of the shadow mask 60 is approximately 50 μm. The shadow mask 60 having a relatively thin thickness has a difficult problem to secure a plan property as compared with the shadow mask having a relatively thick thickness. To solve this problem, by stretching the shadow mask 60, a tension force of a predetermined magnitude is applied to the shadow mask 60, to thereby prevent a modification of the shadow mask 60. However, because the open part 60a of the shadow mask 60 has a small rigidity coefficient value as compared with the blocking part 60b, the open part 60a and the open part 60b are stretched unequally. An accuracy of alignment of both the unequally stretched shadow mask 60 and the substrate becomes lower. Accordingly, when the organic layer 10 is formed by use of the unequally stretched shadow mask 60, an organic layer of a different color is formed at an area of an organic layer having a special color or an organic layer is not formed at an area of the organic layer. Thus, there is a problem that a yield becomes lowered.

SUMMARY OF THE INVENTION

Accordingly, it is an object of the present invention to provide a mask, a method of fabricating the same, and a method of fabricating organic electro-luminescence device using the same that is capable of minimizing a difference of a rigidity coefficient value of both an open part and an blocking part In order to achieve these and other objects of the invention, a mask comprises: an open part formed in a hole type to pass an organic material for forming a first organic layer on a substrate; and a blocking part having a plurality of grooves formed at other areas except for the open part.

When a thickness of the mask is 40 μm to 50 μm, the mask is formed to have a depth of about 20 μm to 30 μm.

A sectional surface of the groove is formed in any one of a circle type and a polygon type.

In order to achieve these and other objects of the invention, a method of manufacturing a mask comprises: preparing a metal plate; and forming an open part formed in a hole type to pass an organic material, and a blocking part having a plurality of grooves formed at other areas except for the open part, by patterning the metal plate.

The forming the open part and the blocking part having the grooves includes: forming a photo-resist on the metal plate; patterning the photo-resist by using a partial exposing mask to form a photo-resist pattern having a stepped part; etching the metal plate by using the photo-resist pattern as a mask to form the open part and the blocking part; ashing the photo-resist pattern; and etching the metal plate of the blocking part by using the ashed photo-resist pattern as a mask to form the blocking part having the grooves.

A sectional surface of the groove is formed in any one of a circle type and a polygon type.

In order to achieve these and other objects of the invention, a method of manufacturing an organic electro-luminescence device comprises: preparing a blocking part having a plurality of grooves and an open part; stretching the mask to apply a tension force of a predetermined magnitude thereto; and forming an organic layer on a substrate by using the stretched mask.

The forming the organic layer on the substrate by using the stretched mask includes making an organic material to be passed via the mask to form the organic layer on the substrate.

A sectional surface of the groove is formed in any one of a circle type and a polygon type.

BRIEF DESCRIPTION OF THE DRAWINGS

These and other objects of the invention will be apparent from the following detailed description of the embodiments of the present invention with reference to the accompanying drawings, in which:

FIG. 6 is a sectional view illustrating the organic electro-luminescence device taken along a line VI-VI' in FIG. 5;

FIGS. 8A to 8C are sectional views illustrating a method of manufacturing an organic layer formed by using the shadow mask shown in FIGS. 5 and 6.

DETAILED DESCRIPTION OF THE PREFERRED EMBODIMENT

Reference will now be made in detail to the preferred embodiments of the present invention, examples of which are illustrated in the accompanying drawings.

Figure 1:
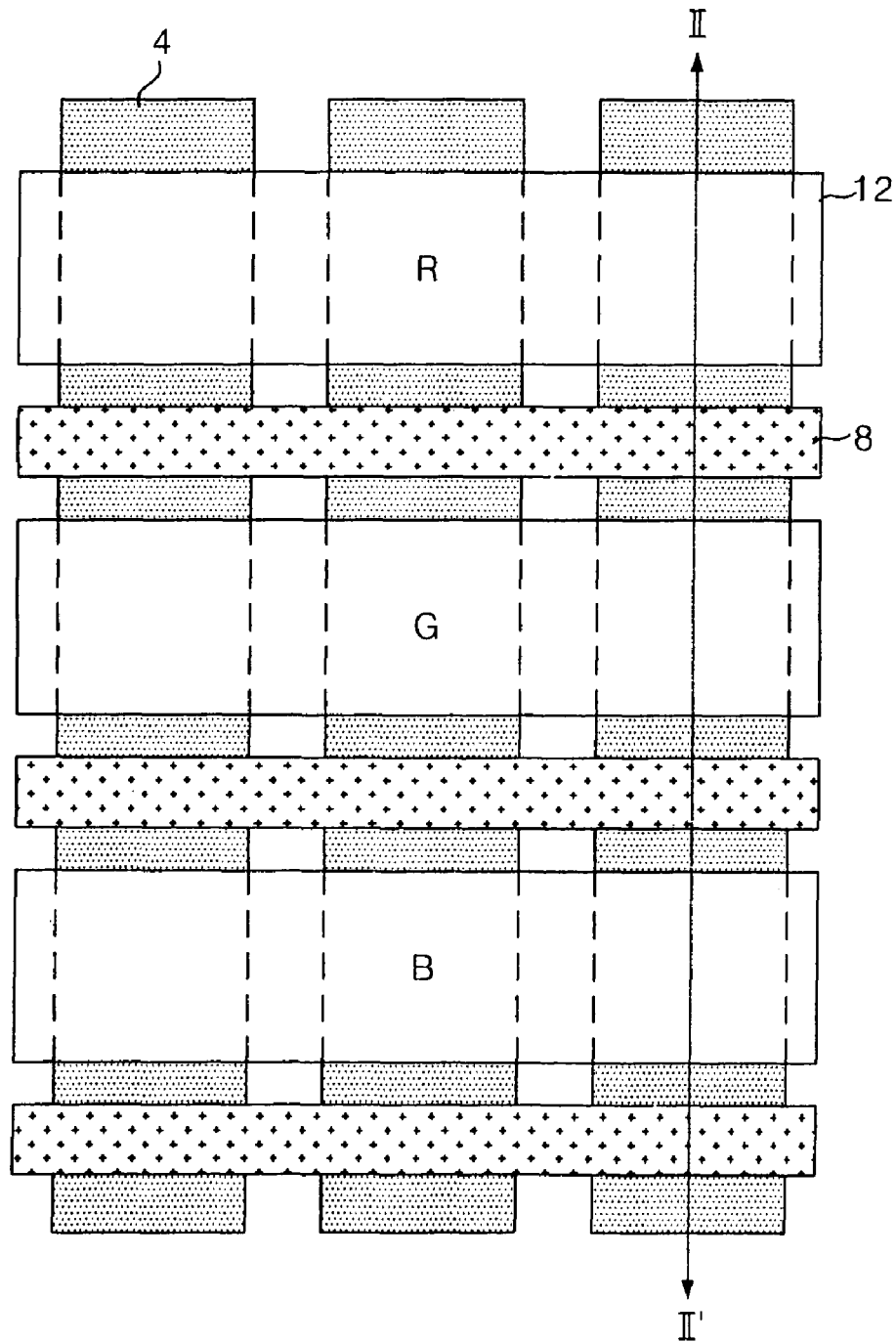
FIG. 1 is a plan view illustrating a related art organic electro-luminescence device.
Figure 2:
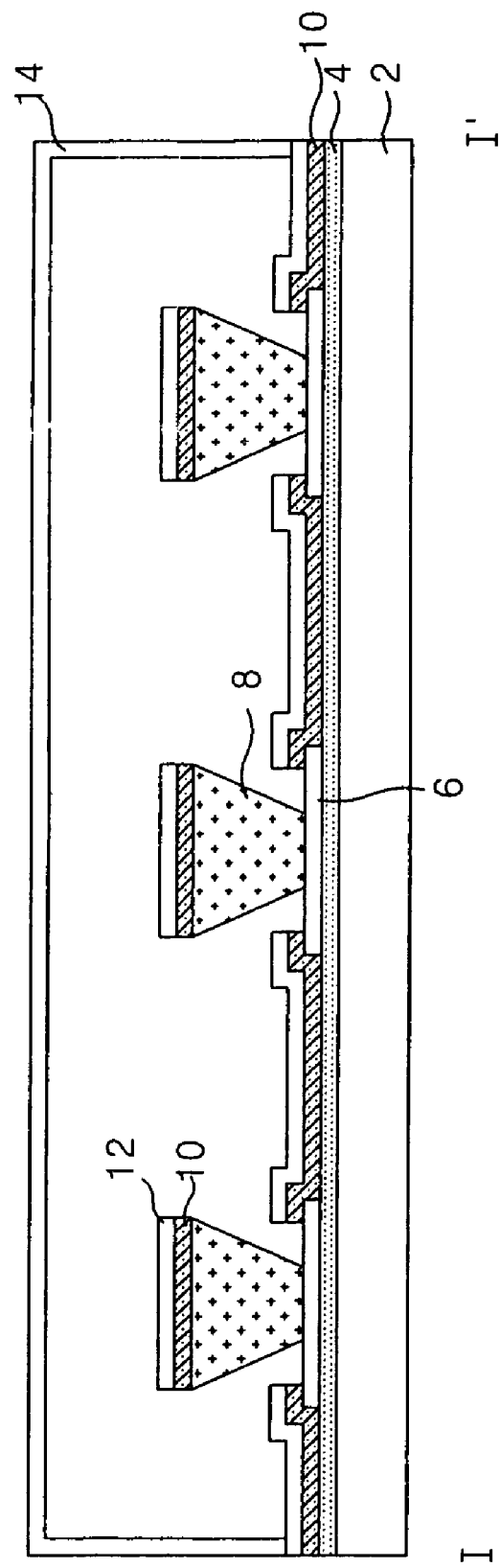
FIG. 2 is a sectional view illustrating the organic electro-luminescence device taken along a line II-II' in FIG. 1.
Figure 3:
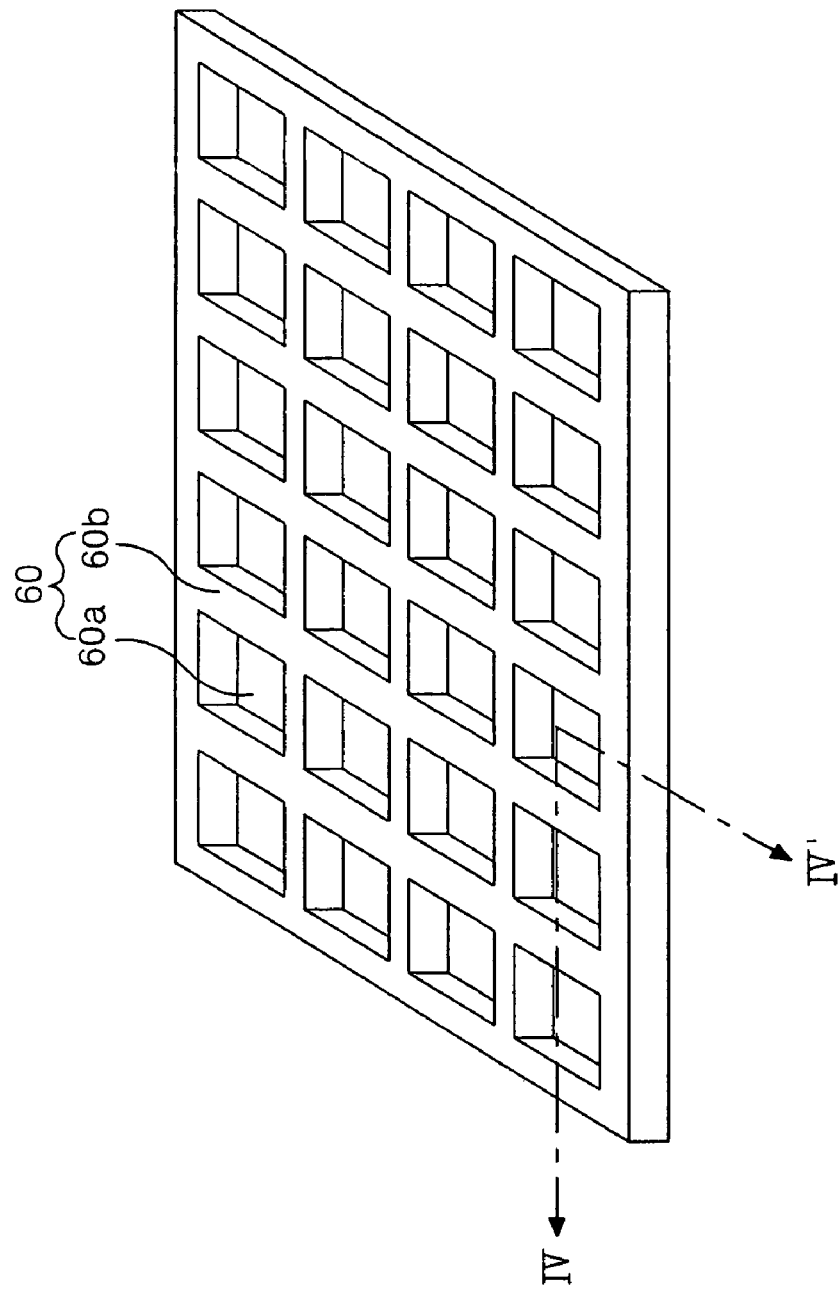
FIG. 3 is a perspective view illustrating a shadow mask used for forming organic layers shown in FIG. 2.
Figure 4:
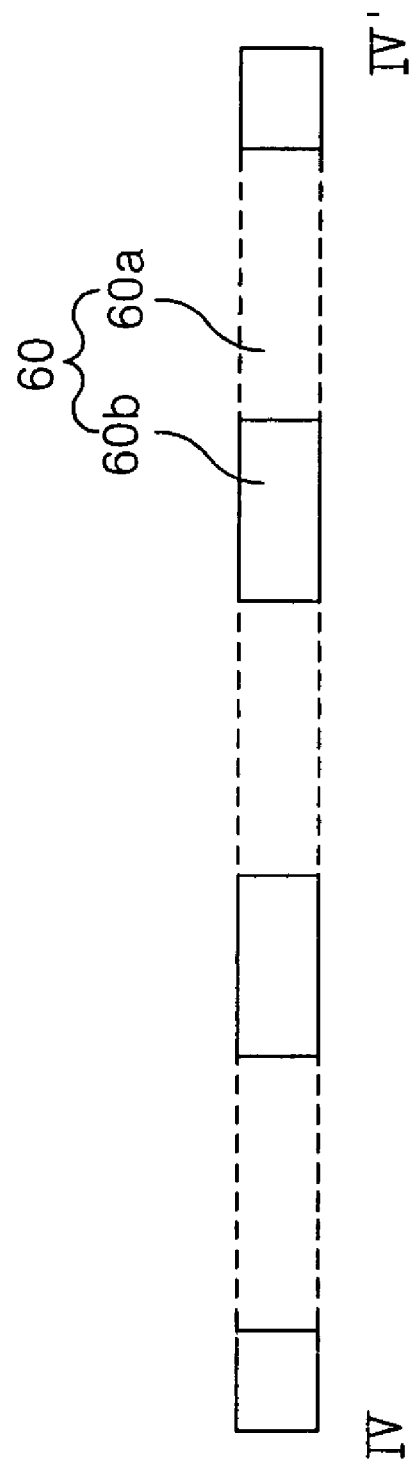
FIG. 4 is a sectional view illustrating the organic electro-luminescence device taken along a line IV-IV' in FIG. 3.
Figure 5:
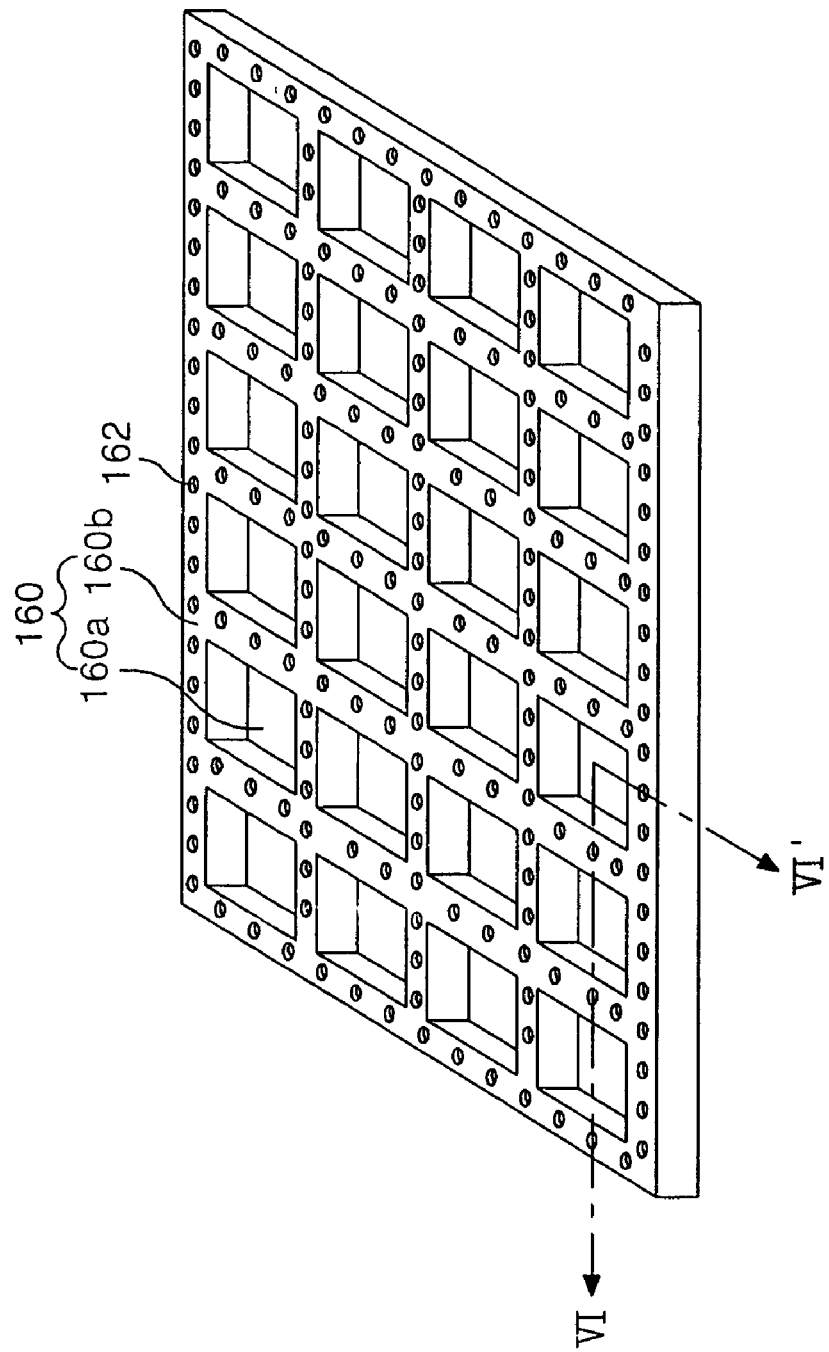
FIG. 5 is a perspective view illustrating a shadow mask for an organic electro-luminescence device according to the present invention.

Hereinafter, the preferred embodiments of the present invention will be described in detail with reference to FIGS. 5 to 8C FIG. 5 is a plan view illustrating a shadow mask for forming an organic layer of an organic EL panel according to the present invention, and FIG. 6 is a sectional view illustrating the shadow mask taken along a line VI-VI' in FIG. 5.

A shadow mask 160 shown in FIGS. 5 and 6 includes an open part 160a formed to overlap with an area where an organic layer of a special color is being formed, and a blocking part 160b formed to overlap with an area where the organic layer of the special color is not being formed.

The open part 160a is formed in a hole type penetrating the shadow mask 160 so that an organic material making the organic layer of the special color is printed on a substrate. Herein, the organic layer includes at least one of a hole carrier layer, a light-emitting layer, and an electron carrier layer.

The blocking part 160b is located between the open parts 160a. The blocking part 160b is formed in such a manner of having a plurality of grooves 162 on at least one a front surface and a rear surface of the shadow mask 160. For instance, when a thickness of the shadow mask 160 is approximately 40 μm to 50 μm, the groove 162 is formed to have approximately depth of 20 μm to 30 μm. A sectional surface of the groove 162 is formed in a circle type or a polygon type.

Because the blocking part 160b having the groove 162 has a rigidity coefficient value reduced as compared with a rigidity coefficient value of the related art blocking part 160b having no groove, it is possible to minimize a difference of the rigidity coefficient value of both the blocking part 160b and the open part 160a. Accordingly, when the shadow mask 160 is stretched, it is possible to minimize an inequality of a stretching amount of both the blocking part 160b and the open part 160a. Thereby, when the organic layer is formed, it is possible to prevent the differed color and the lacked color. Further, because the rigidity coefficient value of the shadow mask is uniform in an entire area by reducing the rigidity coefficient value of the blocking part, it is possible to prevent a modification of the shadow mask.

FIGS. 7A to 7D are sectional views illustrating a method of manufacturing the shadow mask shown in FIGS. 5 and 6.

Figure 7A:
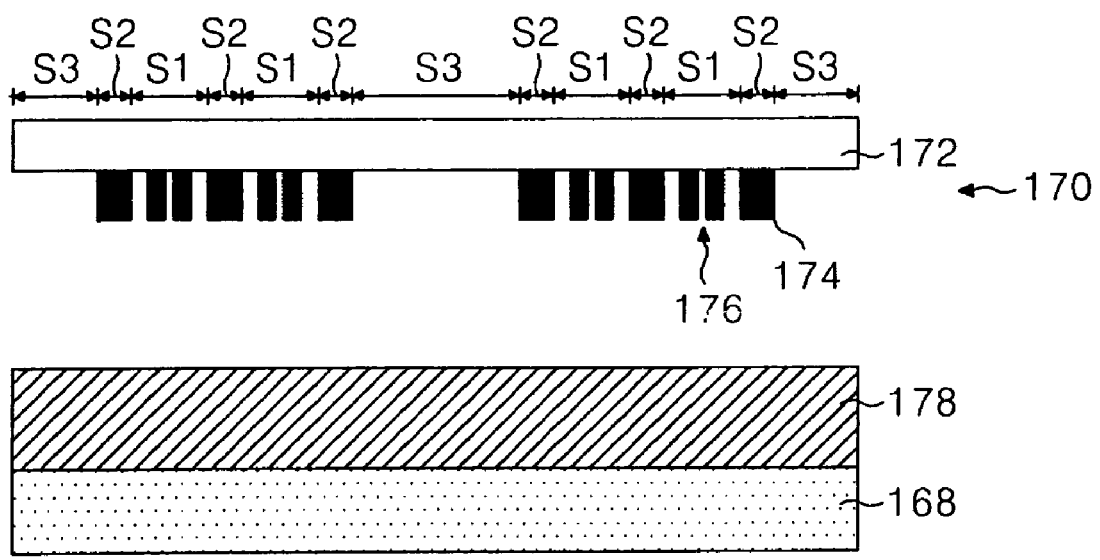
FIGS. 7A to 7D are sectional views illustrating a method of manufacturing the shadow mask shown in FIGS. 5 and 6.
Figure 7B:
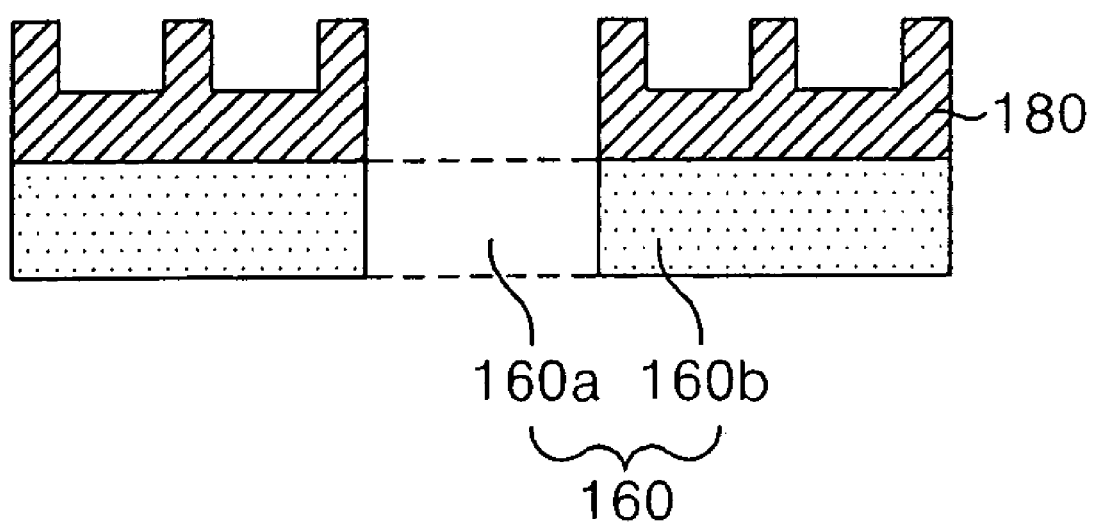
Figure 7C:
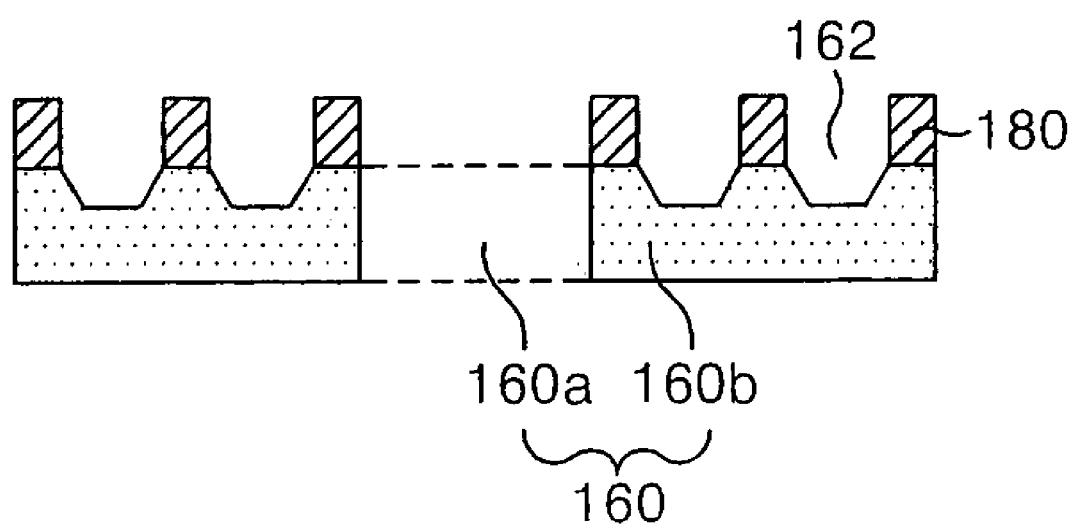

Firstly, as shown in FIG. 7A, a photo-resist 178 is printed on a metal plate 168. The metal plate 168 is made of, e.x., a stainless steel or nickel.

Thereafter, a partial exposing mask 170 is arranged over the metal plate 168 having the photo-resist 178. The partial exposing mask comprises a mask substrate 172 which is a transparent material, a shielding part 174 formed on a shielding region S2 of the mask substrate 172 and a diffractive exposure part 176 (or a semi-transmitting part) formed on a partial exposure region S1 of the mask substrate 172. Herein, a region in which the mask substrate 172 is exposed becomes an exposure region S3. The photo-resist 178 using the partial exposing mask 160 as set forth above is exposed and then developed, to thereby form a photo-resist pattern 180 which has a stepped part in the shielding region and the partial exposure region corresponding to the diffractive exposure part 176 and shielding part 174 of the partial exposing mask 170. That is, the photo-resist pattern 180 formed in the partial exposure region S1 has a height that is lower than a height of the photo-resist pattern 180 formed to the shielding region S2.

The metal plate 168 is patterned by an etching process using the photo-resist pattern 180, so that the shadow mask 160 having the blocking part 160b and the open part 160a is formed.

Figure 7D:
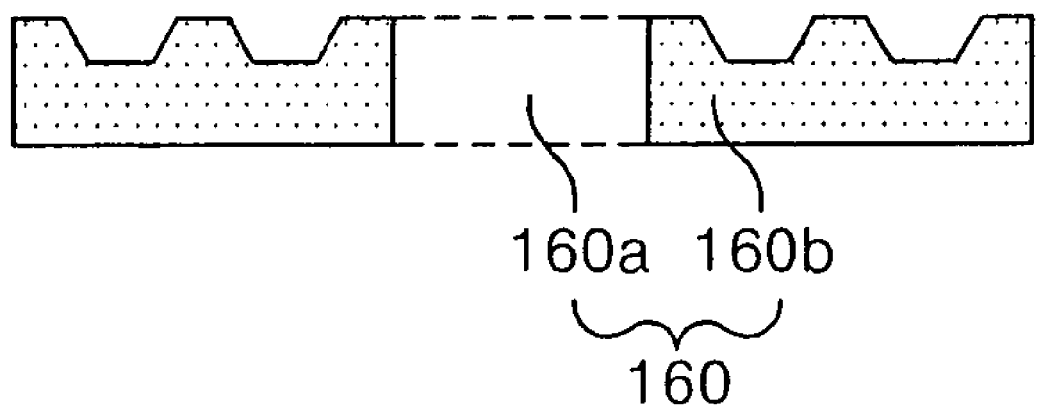

Subsequently, the photo-resist pattern 168 formed in the partial exposure region S1 is removed by the ashing process using an oxygen (O$_2$) plasma, and the photo-resist pattern 180 formed in the shielding region S2 has a lowered height. The metal plate 168 formed in the partial exposure region S1 by etching process using the photo-resist pattern 180 is removed, to thereby form a groove 162 in the blocking part 160b of the shadow mask 160. Next, the photo-resist pattern 180 left on the shadow mask 160 is removed by a stripping process as shown in FIG. 7D.

Otherwise, after a groove of a blocking part in a shadow mask is formed by use of an exposure mask, a hole of an open part in a shadow mask can be formed by use of another exposure mask. Or, after a hole of an open part in a shadow mask is formed by use of an exposure mask, a groove of a blocking part in a shadow mask can be formed by use of another mask.

Figure 8C:
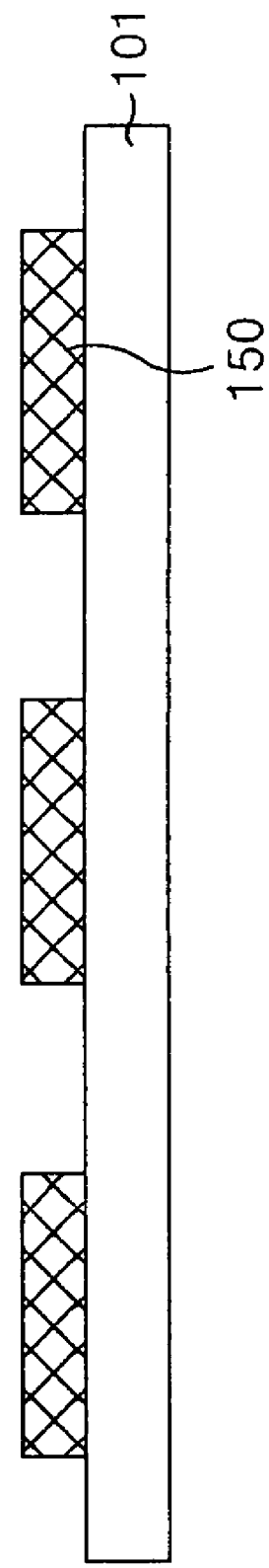

FIGS. 8A to 8C are sectional views illustrating a method of manufacturing an organic layer formed by using the shadow mask shown in FIG. 6.

Firstly, by stretching the shadow mask 60 including the blocking part 160b having the groove 162 shown in FIG. 8A and the open part 160a, a tension force of a predetermined magnitude is applied to the shadow mask 60. Accordingly, the shadow mask can maintain a plan property, so that an accuracy of alignment of both the shadow mask 60 and the substrate becomes improved. Thus, a yield becomes improved.

Such the stretched shadow mask 160 is aligned over the substrate 101, as shown in FIG. 8B. The open part 160a of the shadow mask 160 is located at an area where an organic layer 150 of a predetermined color (e.x., red, green, and blue colors) is being formed, and blocking part 160b is located at an area corresponding to other areas except for the area where the organic layer of the predetermined color is being formed.

An organic material of the predetermined color is screen-printed by use of the shadow mask 160. And then, the organic material of the predetermined color passes through the open part 160a of the shadow mask and is deposited on the substrate 101, to thereby form an organic layer 150 of the predetermined color, as shown in FIG. 8C.

As describe above, in a mask, a method of fabricating the same, and a method of fabricating organic electro-luminescence device using the same according to the present invention, a groove is formed at other areas except for an open part of a shadow mask. Accordingly, because a difference of a rigidity coefficient value of both the blocking part and the open part can be minimized, the shadow mask is stretched in its entire area. An accuracy of alignment of both the equally stretched shadow mask and the substrate becomes improved. Thus, it is possible to improve a yield.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A mask, comprising:

an open part formed in a hole type to pass an organic material for forming a first organic layer on a substrate; and a blocking part having a plurality of grooves formed at other areas except for the open part, wherein the grooves are evenly dispersed and have a common size and a common symmetrical shape so as to minimize a difference of stretching amounts of both the blocking part so that a plan property of the mask is maintained when the mask is stretched.

2. The mask according to claim 1, wherein when a thickness of the mask is 40 μm to 50 μm, the mask is formed to have a depth of about 20 μm to 30 μm.

3. The mask according to claim 1, wherein a sectional surface of the groove is formed in any one of a circle type and a polygon type.

4. A method of manufacturing a mask, the method comprising:

preparing a metal plate; and forming an open part formed in a hole type to pass an organic material, and a blocking part having a plurality of grooves formed at other areas except for the open part, by patterning the metal plate, wherein the grooves are evenly dispersed and have a common size and a common symmetrical shape so as to minimize a difference of stretching amounts of both the blocking part and the open part so that a plan property of the mask is maintained when the mask is stretched.

5. The method according to claim 4, wherein the step of forming the open part and the blocking part having the grooves includes:

forming a photo-resist on the metal plate;

patterning the photo-resist by using a partial exposing mask to form a photo-resist pattern having a stepped part;

etching the metal plate by using the photo-resist pattern as a mask to form the open part and the blocking part;

ashing the photo-resist pattern; and etching the metal plate of the blocking part by using the ached photo-resist pattern as a mask to form the blocking part having the grooves.

6. The method according to claim 4, wherein a sectional surface of the groove is formed in any one of a circle type and a polygon type.

7. A method of manufacturing an organic electro-luminescence device, the method comprising:

preparing a mask including an open part and a blocking part having a plurality of grooves;

stretching the mask to apply a tension force of a predetermined magnitude thereto; and forming an organic layer on a substrate by using the stretched mask, wherein the grooves are evenly dispersed and have a common size and a common symmetrical shape so as to minimize a difference of stretching amounts of both the blocking part and the open part so that a plan property of the mask is maintained when the mask is stretched.

8. The method according to claim 7, wherein the step of forming the organic layer on the substrate by using the stretched mask includes making an organic material to be passed via the mask to form the organic layer on the substrate.

9. The method according to claim 7, wherein a sectional surface of the groove is formed in any one of a circle type and a polygon type.

* * * * *